US008238849B2

(12) United States Patent
Pratt

(10) Patent No.: US 8,238,849 B2
(45) Date of Patent: Aug. 7, 2012

(54) METHOD AND SYSTEM OF ADAPTIVE PREDISTORTION OF A WIRELESS TRANSMITTER

(75) Inventor: Patrick Pratt, Mallow (IE)

(73) Assignee: Freescale Semiconductor, Inc., Austin, TX (US)

(*) Notice: Subject to any disclaimer, the term of this patent is extended or adjusted under 35 U.S.C. 154(b) by 290 days.

(21) Appl. No.: 12/682,461

(22) PCT Filed: Oct. 18, 2007

(86) PCT No.: PCT/IB2007/054238
§ 371 (c)(1),
(2), (4) Date: Apr. 9, 2010

(87) PCT Pub. No.: WO2009/050537
PCT Pub. Date: Apr. 23, 2009

(65) Prior Publication Data
US 2010/0248658 A1    Sep. 30, 2010

(51) Int. Cl.
*H04B 1/04* (2006.01)
(52) U.S. Cl. ............ 455/114.3; 375/297; 330/149
(58) Field of Classification Search ........... 455/63.1, 455/67.13, 114.2, 114.3, 127.1, 127.2; 375/296, 375/297; 330/2, 136, 149
See application file for complete search history.

(56) References Cited

U.S. PATENT DOCUMENTS

| 6,246,286 | B1* | 6/2001 | Persson ............ 330/149 |
| 6,496,062 | B1* | 12/2002 | Nitz et al. ............ 330/136 |
| 6,853,246 | B2* | 2/2005 | Bauder et al. ............ 330/149 |
| 6,928,122 | B2* | 8/2005 | Opas et al. ............ 375/296 |
| 7,288,988 | B2* | 10/2007 | Braithwaite ............ 330/149 |
| 2004/0179629 | A1 | 9/2004 | Song et al. |
| 2005/0007193 | A1 | 1/2005 | Hwang et al. |
| 2006/0029155 | A1 | 2/2006 | Shako et al. |
| 2008/0243899 | A1 | 10/2008 | Staudinger et al. |
| 2008/0298500 | A1 | 12/2008 | Norris et al. |
| 2009/0111399 | A1 | 4/2009 | Norris et al. |

FOREIGN PATENT DOCUMENTS

| WO | 01/05026 A | 1/2001 |
| WO | 01/29963 A1 | 4/2001 |

OTHER PUBLICATIONS

Young-Doo Kim et al: "Joint Adaptive Compensation for Amplifier Nonlinearity and Quadrature Modulation Errors" Vehicular Technology Conference 2006, VTC 2006 Spring, IEEE 63rd, vol. 5, pp. 2290-2293, 2006.
International Search Report and Written Opinion correlating to PCT/IB2007/054238 dated Aug. 27, 2008.

* cited by examiner

*Primary Examiner* — Quochien B Vuong

(57) ABSTRACT

A method of adaptive predistortion of a power amplifier, characterized in that the method comprises the steps of: storing values of a plurality of corresponding first and second coefficients; selecting one of the stored first coefficients; processing a first signal with the first coefficient to produce an input signal for the power amplifier; amplifying the input signal in the power amplifier to produce an output signal; calculating an error value from the output signal and a previously selected first coefficient; selecting a stored second coefficient corresponding with the previously selected first coefficient; updating the previously selected first coefficient with a value calculated from the error value and the second coefficient; updating the second coefficient; and replacing the previously selected first coefficient and corresponding second coefficient with the updated first and second coefficients respectively.

20 Claims, 8 Drawing Sheets

Prior Art

METHOD AND SYSTEM OF ADAPTIVE PREDISTORTION OF A WIRELESS TRANSMITTER

FIELD OF THE INVENTION

This invention relates to a method and system of adaptive predistortion, and more particularly, but not exclusively, a method and system of adaptive predistortion of a wireless transmitter.

BACKGROUND OF THE INVENTION

A power amplifier (PA) is inherently non-linear in nature. When used in a wireless transmitter, a PA's non-linearity generates spectral regrowth, which leads to adjacent channel interference and violations of the out-of-band emission requirements mandated by regulatory authorities. The non-linearity also causes in-band distortion, which degrades the transmitter's Bit Error Rate (BER). Referring to FIG. 1, pre-distortion is a technique which compensates for PA non-linearity by processing a signal x(n) with a predistortion device (PD) 10, prior to amplification by the PA 12. The PD 10 has inverse characteristics to the PA 12. Thus, pre-processing the signal x(n) by the PD 10 effectively neutralises the non-linearities of the PA 12.

The parameters of a PA can vary (e.g. with changes in supply voltage, temperature etc.) and the PD must be adaptable to those changes. Adaptive PreDistortion (APD) systems for wireless handsets are constrained to use economical (low cost and size) adaptation engines such as the Least Means Squared (LMS) engine to train the PD. The LMS engine employs a constant 'learning factor' that must be chosen to satisfy both convergence speed and noise rejection. Accordingly, as the noise level in a signal increases, the learning factor must be turned down, thereby compromising convergence speed. However, as the convergence speed drops, key specifications (e.g. switching output RF spectrum [ORFS, output radio frequency spectrum] etc.) can fail when the PA distortion characteristics change.

Many conventional APD systems are based on memory-less models for both the PA and the PD. However, PAs manifest time-dependent memory effects (i.e. PA memory). Thus, in chasing PA memory effects, conventional memory-less APD systems experience noisy PD gain updates (as shown in FIG. 2).

An APD requires a feedback path to detect or measure how the APD is performing compared to an ideal transmitter signal. This detector consists of, for example, a coupler, a down converter, and an ADC, which in addition to measuring the APD performance also acts as a receiver. Given that the detector LO will be incoherent with any blockers or interferers received, the resultant down converted, baseband signal will manifest as noise. Unless preventive measures are taken, the increase in receiver noise can be transferred to the wireless transmitter, thereby degrading the transmitter Carrier to Interference Plus Noise Ratio [CINR]. In other words, adjacent channel interference and PA memory effects manifest as additional noise sources, which when combined with underlying circuit noise in a wireless transmitter causes the overall performance of the transmitter to suffer (e.g. degraded ORFS performance and CINR). Further, in providing immunity to the additional noise, the LMS learning factor in a conventional APD system may need to be detuned so much that convergence of the PD is critically compromised.

WO 01/29963 mentions Recursive Least Squares (RLS) as a faster converging algorithm for predistortion than LMS. Y. Doo Kim et al, Vehicular Technology Conference 2006, VTC 2006 Spring, IEEE 63$^{rd}$, Vol 5, P. 2290-2293 describes a generalised polynomial based RLS algorithm for solving a predistortion and quadrature compensation problem.

SUMMARY OF THE INVENTION

The present invention provides a system and method for adaptive predistortion as described in the accompanying claims.

BRIEF DESCRIPTION OF THE DRAWINGS

Reference will now be made, by way of example, to the accompanying drawings, in which.

DETAILED DESCRIPTION

(1) Prior Art APD System

Figure 1:
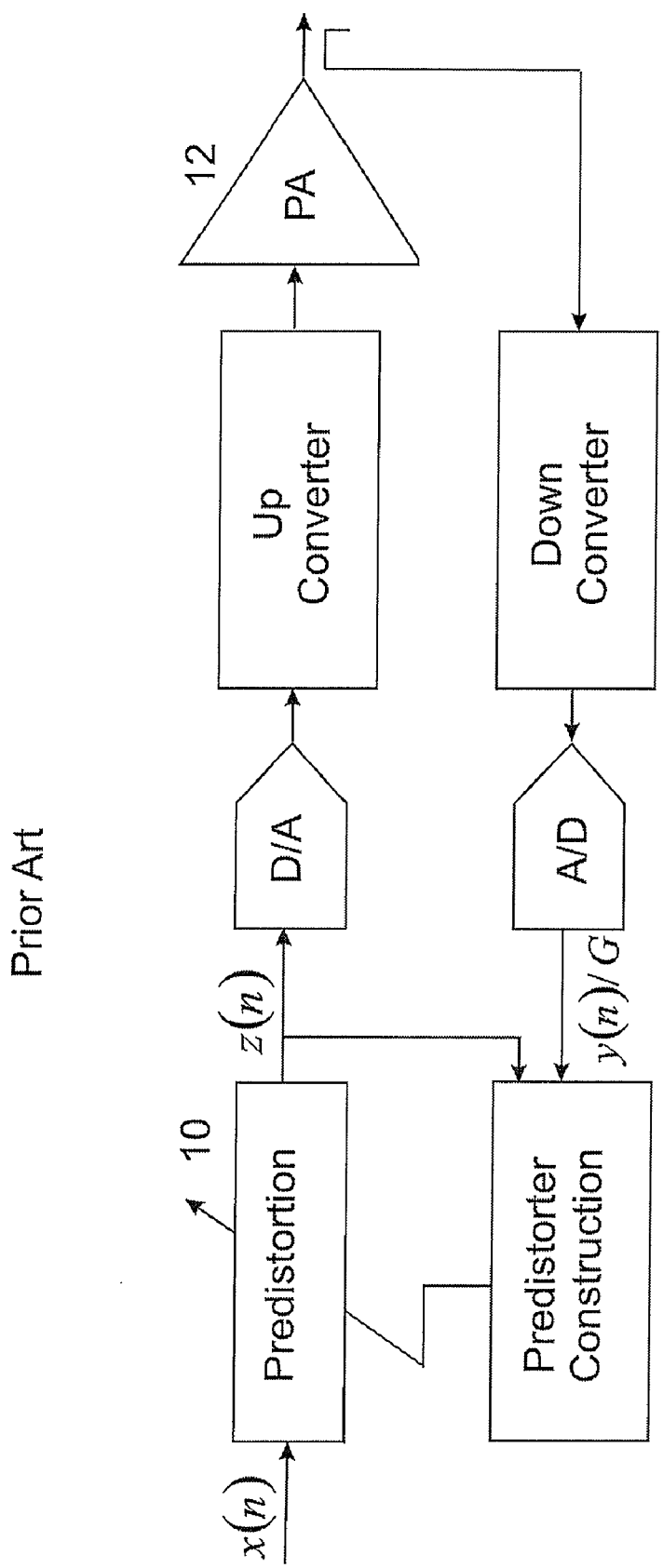
FIG. 1 is a is a block diagram of a simplified prior art predistortion system.
Figure 2:
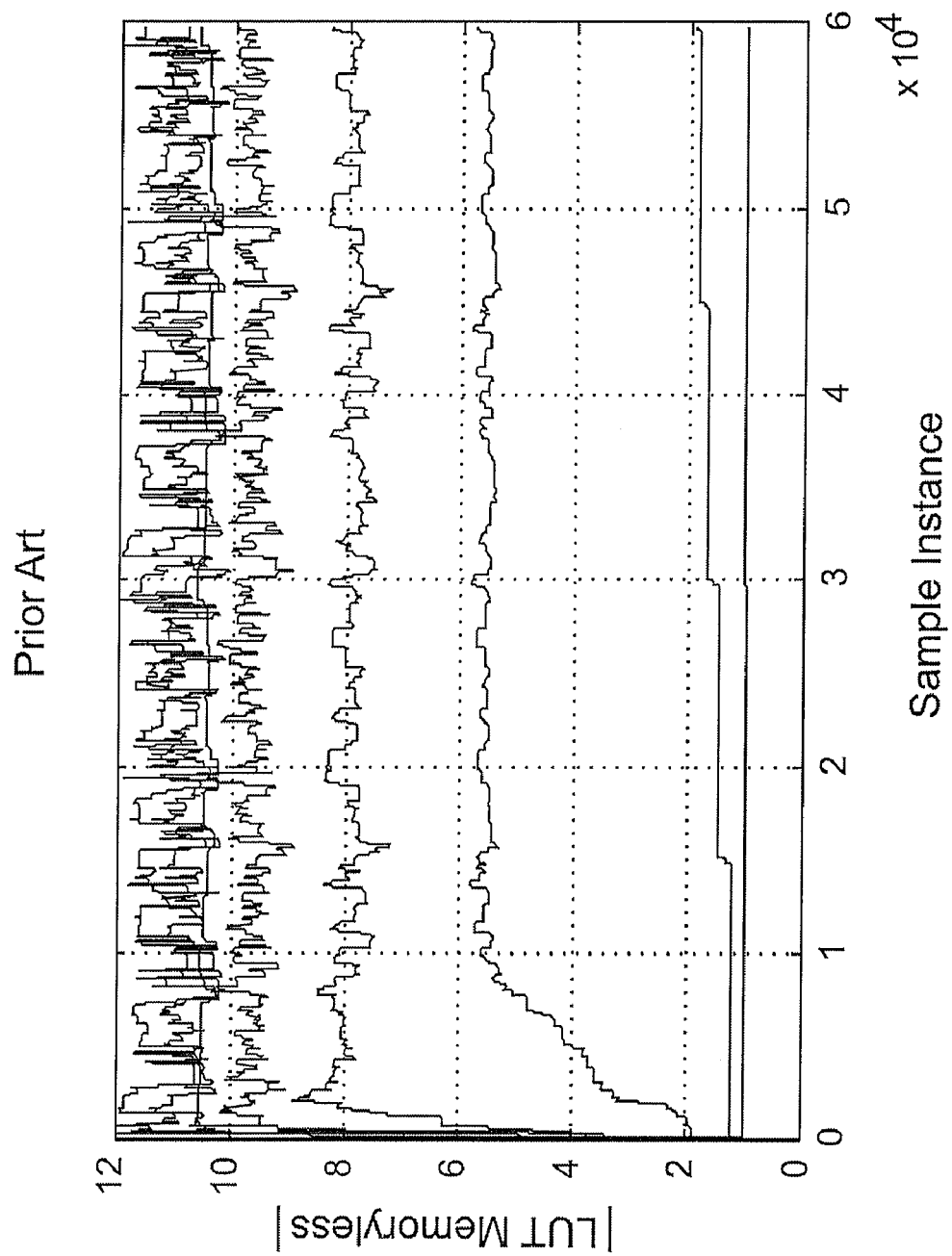
FIG. 2 is a graph of the variation of PD gain with time in a prior art memory-less LMS predistortion scheme.
Figure 3:
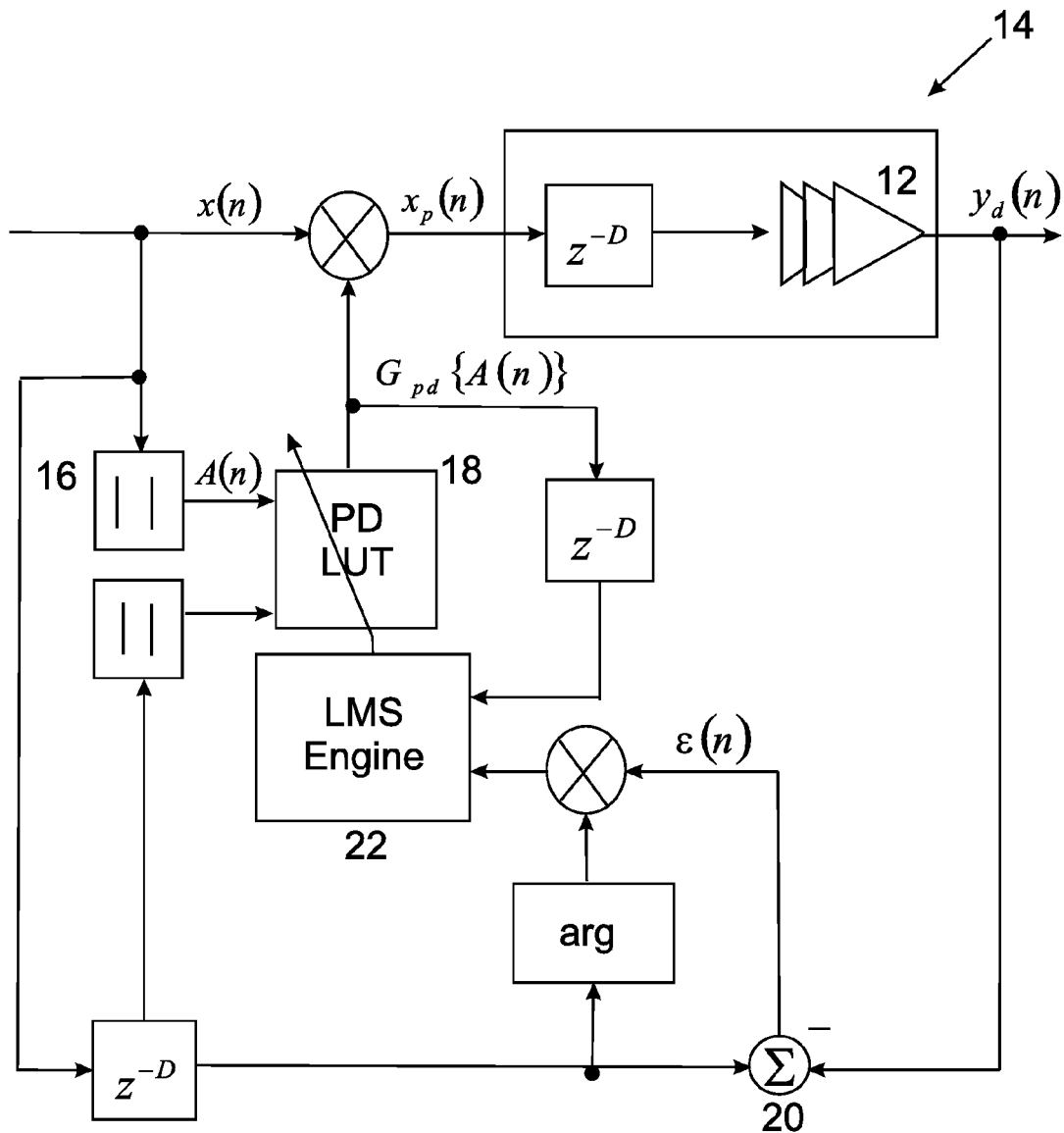
FIG. 3 is a block diagram of a generic APD system employing a Look-Up Table [LUT]

Referring to FIG. 3, a prior art APD system 14 receives a complex input signal x(n) (at time interval n). The input signal x(n) is processed by a modulus (or absolute) block 16 to calculate a real-valued signal A(n) (wherein A(n)=|x(n)|). An LUT 18 contains gain coefficients $G_{pd}(i)$, i=1 to L which represent the PD functionality of the prior art APD system 14. Since PA non-linearity is a function of amplitude, the LUT 18 is addressed by the amplitude of the input signal x(n). Thus, the real-valued signal A(n) is used to select from the LUT 18, an appropriate gain coefficient $G_{pd}(A(n))$. The baseband complex signal x(n) is then multiplied by the gain coefficient $G_{pd}(A(n))$ before being transmitted to a PA 12. The gain coefficients are updated in a process wherein a summer block 20 subtracts an output signal $y_d(n)$ from the PA with a delayed version of the input signal x(n−D) to generate an error variable ε(n). The (delayed/synchronised) transmitter phase is removed from the error (as per expression (2) below) as only the phase component incurred in transmitting (APD+PA) is required to train the APD. This process is carried out by multiplier and arg blocks in the prior art APD system 14. The error variable ε(n) is transmitted to an LMS engine 22 together with an associated delayed gain coefficient. Using these values, the LMS engine 22 adjusts the gain coefficients in the LUT 18 in accordance with $$G_{pd}\{|x(n-D)|\} \Leftarrow G_{pd}\{|x(n-D)|\} + \mu \epsilon(n) \quad (1)$$

$$\epsilon(n) = \{x(n-D) - y_d(n)\} e^{-j\phi(n-D)} \quad (2)$$

$\mu$ is a fixed adaptation factor chosen to trade off convergence speed and noise rejection. For example, a large value of $\mu$ provides faster convergence (assuming stability) but poorer noise rejection.

(2) First and Second Embodiments (2.1) General Overview of the First and Second Embodiments The first and second embodiments are based on the general premise of replacing the single constant adaptation factor $\mu$ of prior art APD systems, with a plurality of adaptation factors. In particular, the first and second embodiments provide a separate adaptation factor for each PD gain coefficient, wherein each of the adaptation factors decays over time, from a large initial value (which aids convergence) to a smaller value (to minimise the impact of noise) as the embodiments converge. In particular, the behaviour of each adaptation factor can be described by the general expression $$\mu(\text{new}) = \mu(\text{old}) + \text{update} \quad (3)$$

(or even more generally by the expression $\mu(\text{new}) = f(\mu(\text{old}))$).

The following discussion describes two embodiments, which mainly differ in the nature of the update terms used in expression (3) above. In particular, the first embodiment employs an RLS update term, whereas the second embodiment employs a first order exponentially decaying update term. Nonetheless, both embodiments share the general principle of using separate time-varying adaptation factors for each PD gain coefficient.

(2.2) First Embodiment

Figure 4:
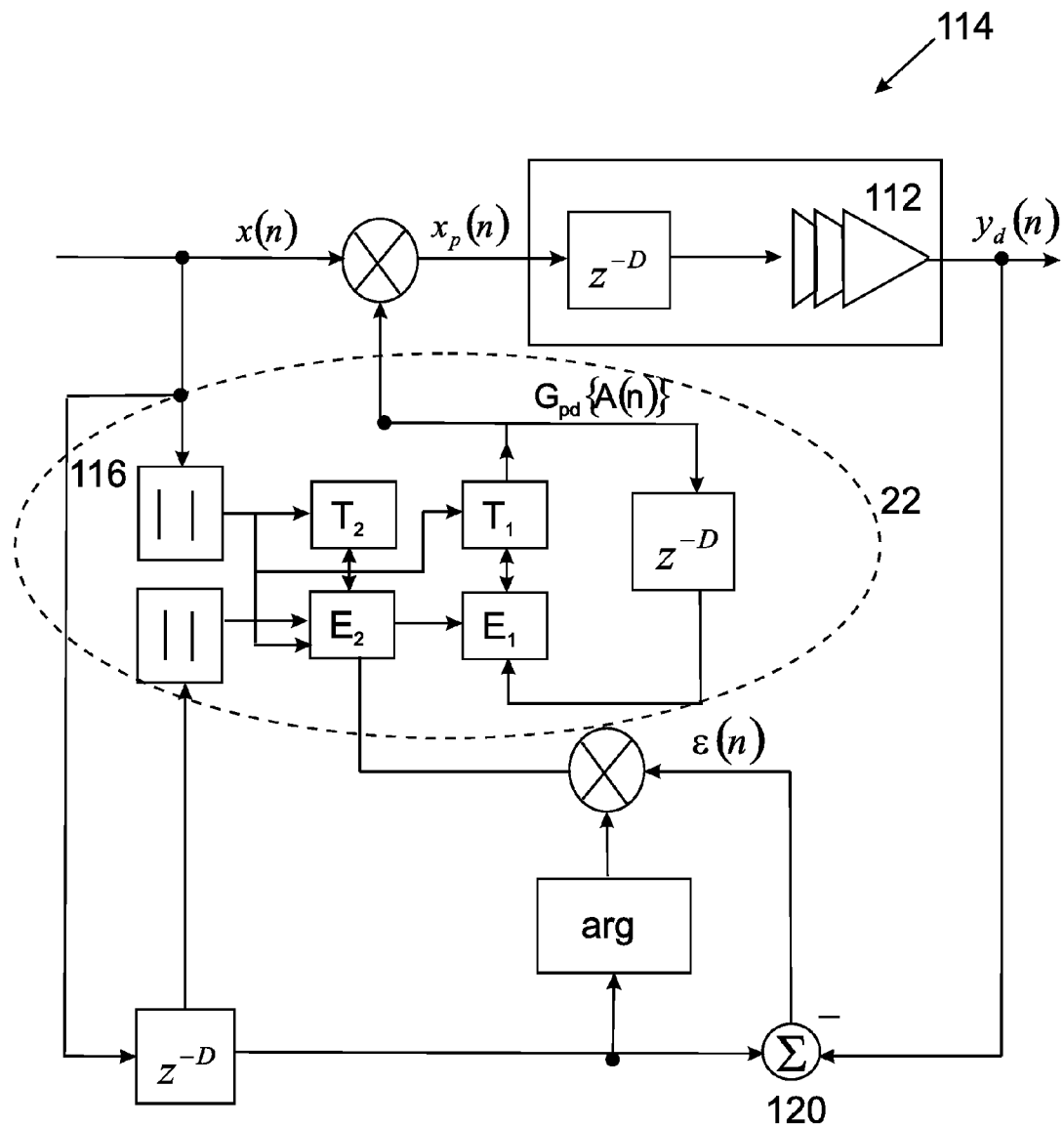
FIG. 4 is a block diagram of the APD system in accordance with one embodiment of the invention, given by way of example.

Referring to FIG. 4 in common with a prior art APD system, the first embodiment 114 comprises a PA 112 and a modulus block 116 which processes an input signal x(n). However, in place of the single LUT and LMS engine of the prior art APD system, the first embodiment comprises two LUTs, namely a gain coefficient LUT $T_1$ and a adaptation factor LUT $T_2$. The two LUTs ($T_1$, $T_2$) interact with two update engines, namely a gain update engine $E_1$ and an adaptation factor update engine $E_2$. The assembly 22 of the LUTs $T_1$ and $T_2$ and update engines $E_1$ and $E_2$ are depicted in more detail in FIG. 5.

Figure 5:
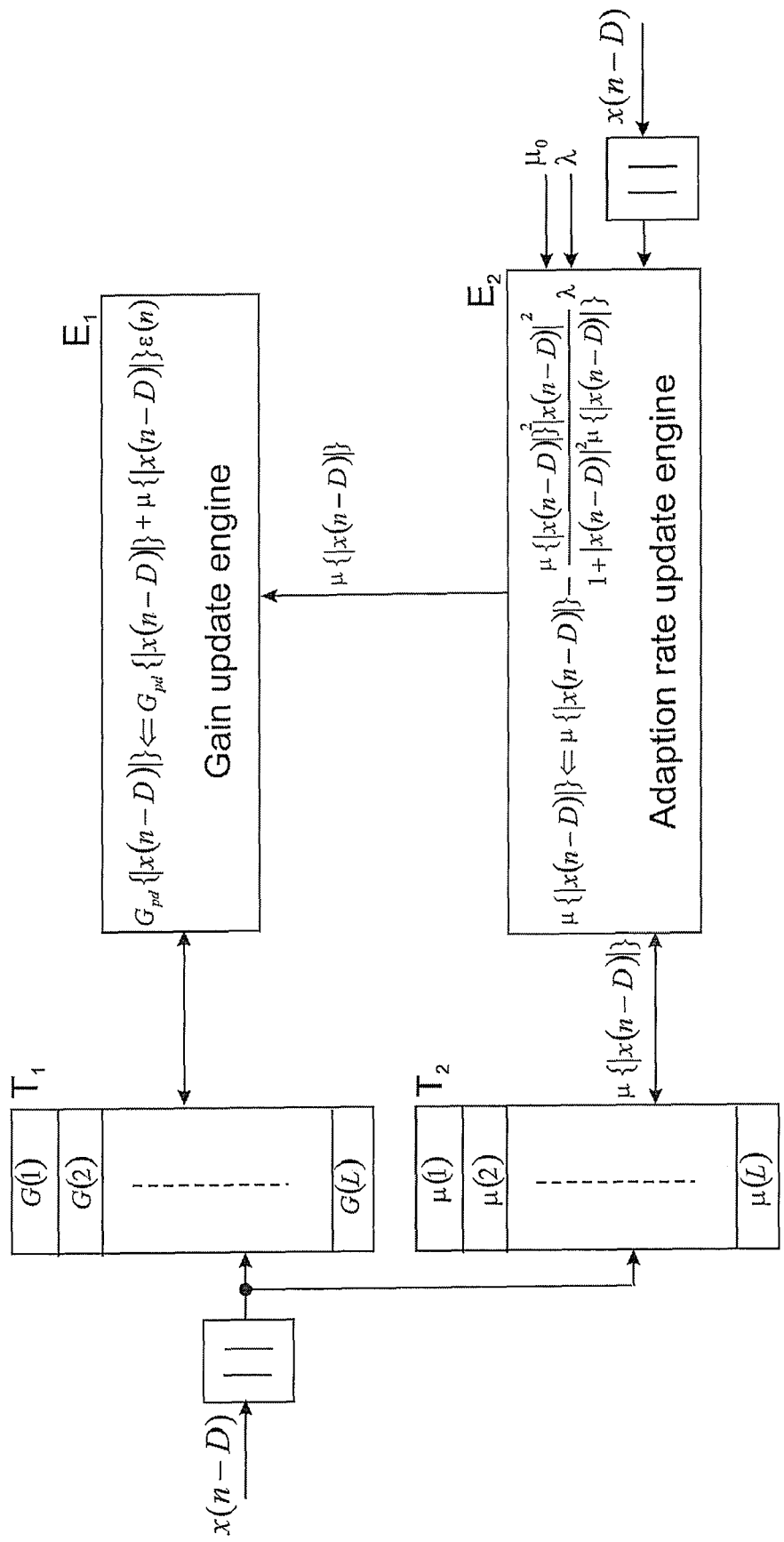
FIG. 5 is a block diagram of the assembly of LUTs and adaptation engines in the embodiment shown in FIG. 4.

Combining FIGS. 4 and 5, it can be seen that the gain coefficient LUT $T_1$ comprises L gain coefficients $G_{pd}(i)$, $i=1$ to L. The adaptation factor LUT $T_2$ comprises L time-varying adaptation factors $\mu(i)$, $i=1$ to L, or in other words, a time-varying adaptation factor $\mu(i)$ for each gain coefficient $G_{pd}(i)$. The separate adaptation factors for each gain coefficient are advantageous in the presence of noise caused explicitly by circuit and numerical noise or implicitly by memory effects and interferers.

The gain update engine $E_1$ adjusts the gain coefficients $G_{pd}(i)$ of the gain coefficient LUT $T_1$, in accordance with the expression:

$$(4) \quad G_{pd}\{|x(n-D)|\} \Leftarrow G_{pd}\{|x(n-D)|\} + \mu\{|x(n-D)|\} \epsilon(n)$$

This expression differs from the LMS gain coefficient update expression (1) by the replacement of the fixed adaptation factor $\mu$ with the time-varying adaptation factor $\mu\{|x(n-D)|\}$. The adaptation factor update engine $E_2$ updates an adaptation factor $\mu\{|x(n-D)|\}$ in accordance with an expression modelled after the covariance matrix of the RLS algorithm or the Kalman gain of a Kalman estimator:

$$\mu\{|x(n-D)|\} \Leftarrow \mu\{|x(n-D)|\} - \frac{(n-D)\mu\{|x(n-D)|\}}{1+x*(n-D)\mu} \lambda = \quad (5)$$

$$\{|x(n-D)|\} x(n-D)$$

$$\mu\{|x(n-D)|\} - \frac{\mu\{|x(n-D)|\}^2 |x(n-D)|^2}{1+|x(n-D)|^2 \mu\{|x(n-D)|\}} \lambda$$

$\lambda$ is a 'forgetting factor' $0 <= \lambda <= 1$, wherein if $\lambda=0$, (5) reverts to the traditional LMS gain update expression (1). Similarly, if $\lambda=1$, (5) becomes that of an RLS algorithm. It should be noted that although RLS and Kalman estimators have been used for APD in the prior art, the first embodiment is unique insofar as it uses multiple learning factors, one per APD gain value, wherein the multiple learning factors are individually adjusted by the first embodiment.

Figure 6:
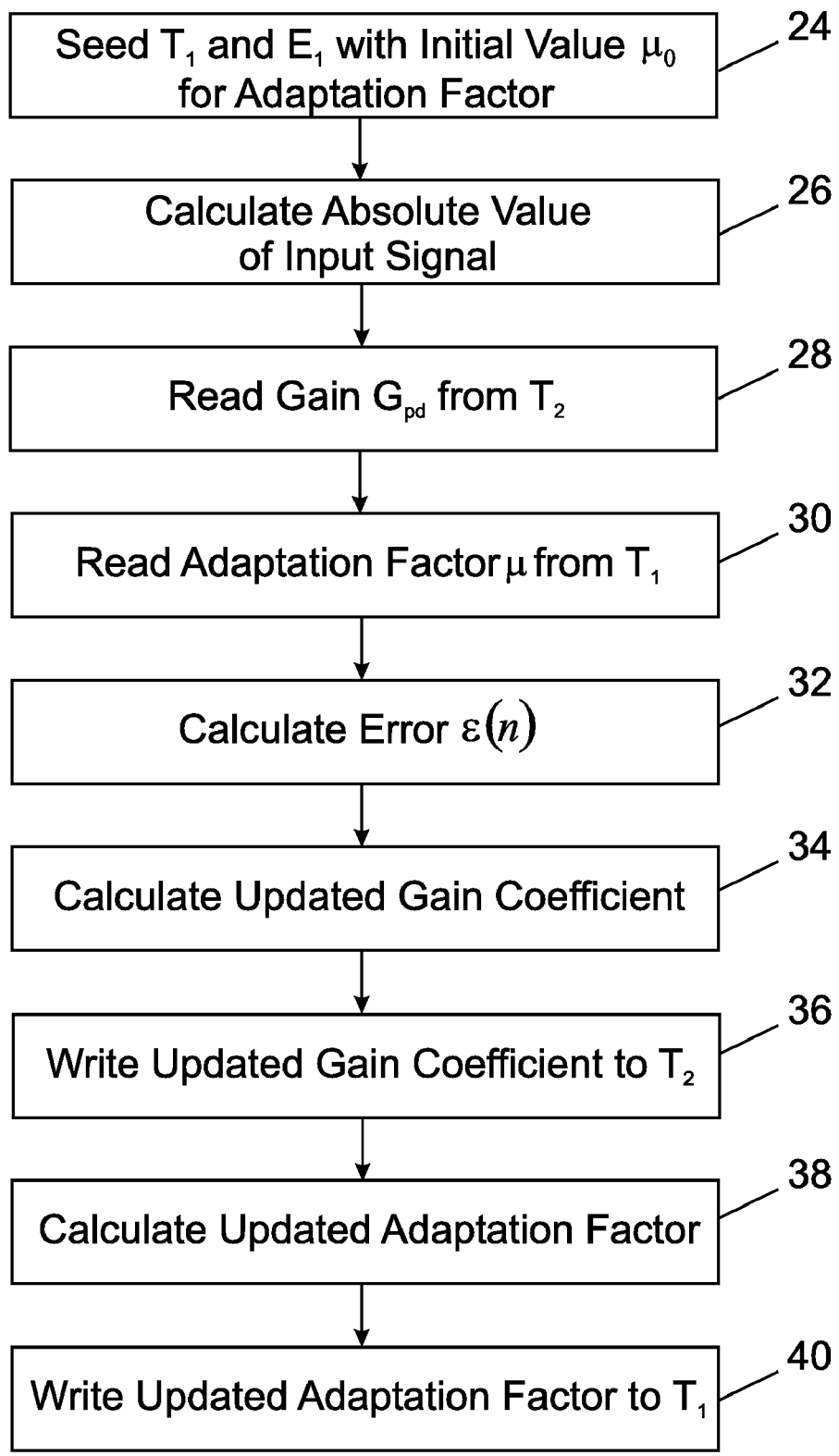
FIG. 6 is a flowchart of the operation of the embodiment shown in FIG. 4.

Referring to FIG. 6, the first step of the embodiment, involves seeding 24 the adaptation factor update engine $E_2$ and the adaptation factor LUT ($T_2$) with initial values $\mu_0$. The gain coefficient LUT ($T_1$) is also seeded (not shown) with its own starting values. In the next step, the absolute value of an input signal x(n) (at time instant n) is calculated 26. The absolute value of x(n) (i.e. |x(n)|) serves as the address for extracting 28, 30 a particular gain coefficient ($G_{pd}\{|x(n-D)|\}$) (learning factor is addressed by delayed input amplitude, |x(n-D)|) adaptation factor $\mu\{|x(n-D)|\}$) from the adaptation factor LUT $T_2$ and gain coefficient LUT $T_1$ (i.e. two addresses, current one |x(n)| to read current $G_{pd}$ to be applied to TX and delayed address |x(n-D)| to be used in the update engines.

As before, the absolute value |x(n)| (of input signal x(n)) is multiplied by the gain coefficient $G_{pd}\{|x(n)|\}$ before being transmitted to the PA (i.e. PA 112 in FIG. 4). Similarly, an error value $\epsilon(n)$ is calculated 32 from the output signal $y_d(n)$ and a delayed version of the input signal x(n-D). In accordance with expression 4, the gain coefficient (i.e. $G_{pd}\{|x(n-D)|\}$) corresponding with the delayed input signal is updated 34 by:

multiplying the error value $\epsilon(n)$ with the adaptation factor ($\mu\{|x(n-D)|\}$) corresponding with the delayed input signal; and adding it to the gain factor (i.e. $G_{pd}\{|x(n-D)|\}$).

The updated gain coefficient $G_{pd}\{|x(n-D)|\}$ is then written 36 back to $T_1$. In addition, the learning factor $\mu\{|x(n-D)|\}$ (corresponding with the delayed input signal) is updated 38 in accordance with expression 5; and the updated learning factor $\mu\{|x(n-D)|\}$ written 40 back to $T_2$.

In use, the learning factor $\mu\{|x(n-D)|\}$ is systematically reduced from an initially 'large' value ($\mu_0$) (to allow faster initial convergence) towards zero (to provide improved noise rejection), thereby simultaneously satisfying the requirements of rapid convergence and noise rejection.

It should be noted that because of numerical limitations arising from finite arithmetic, the adaptation factors might erroneously become negative, leading to instability of the APD system. To avoid this, a check is performed at each iteration of the update equation (5), to see if the result is negative. If the result is negative, the result is set to zero (i.e. if μ(new)<0 then μ(new)=0)

(2.3) Second Embodiment

The second embodiment employs the same basic multiple LUT and adaptation engine structure of the first embodiment. However, in place of adaptation factor update expression (4) (which required a computationally intensive divide operation to calculate the final term [known as an RLS update term]

$$\frac{\mu\{|x(n-D)|\}^2|x(n-D)|^2}{1+|x(n-D)|^2\mu\{|x(n-D)|\}}\lambda\Bigg),$$

the second embodiment uses an alternative adaptation factor update expression, which includes 'directional information' based on the sign of the estimation error. In particular, during operation, the second embodiment records the sign of the error associated with each gain entry. Naturally, this will require the presence of an extra LUT of size one bit×L (i.e. a one bit wide LUT or, in practice, a L length register). If the sign of the current estimation error is unchanged (relative to the sign the relevant gain entry had when last visited), the adaptation factor remains unchanged. However, if the error sign has changed, the learning factor is reduced. The combinatorial expression for this process is given by:

if sign{error(addr,old)}=sign{error(addr,new)}

μ(address,new)=μ(address, old)

else

μ(address,new)=μ(address, old)*forgetting_factor   (6)

wherein 0<forgetting factor <=1 (=1 to revert to pure LMS, = 0 to turn off)

Thus, an adaptation factor reduces in a first order exponential fashion when the sign of the associated error changes, wherein the sign of the error changes when the gain estimate 'steps over' its optimum value. The process of reducing the adaptation factor (also known as the step size) accelerates convergence towards the optimum, and using the sign of the error to determine whether reduction should occur, ensures premature termination does not occur.

(3) Proof of Concept

Figure 7:
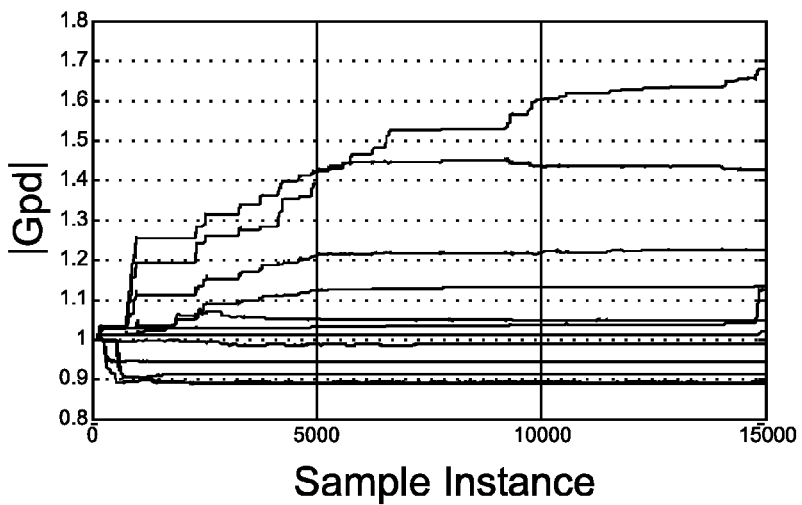
FIG. 7 is a graph of gain coefficients over time from a simulation of a prior art LMS-based APD system using an adaptation factor $\mu=0.3$.
Figure 8:
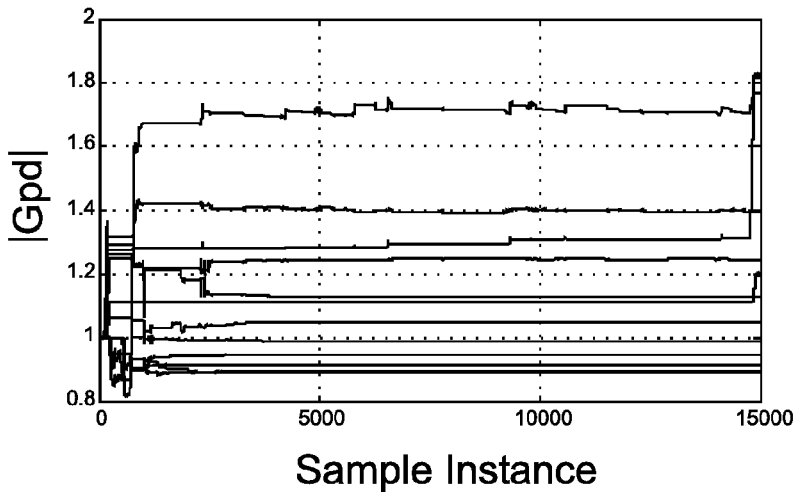
FIG. 8 is a graph of gain coefficients over time from a simulation of the RLS-based APD of the embodiment shown in FIG. 4, using an initial adaptation factor $\mu_0=0.3$ and a forgetting factor $\lambda=0.01$.
Figure 9:
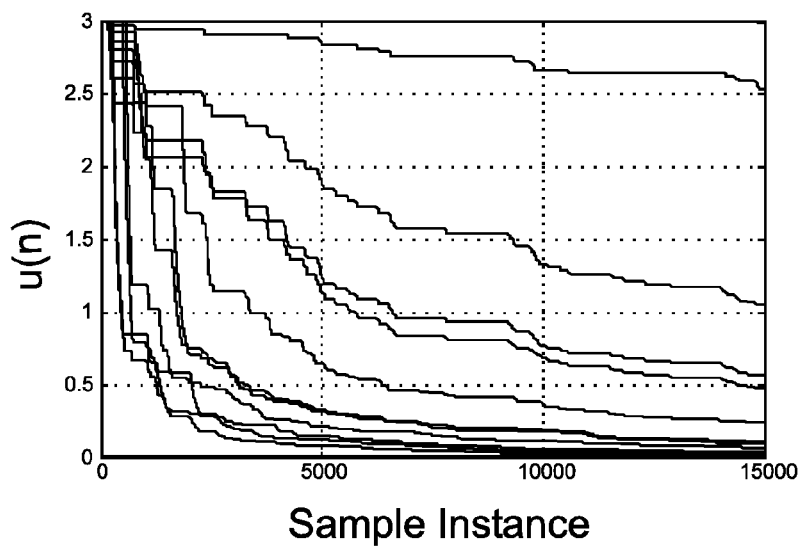
FIG. 9 is a graph of adaptation factors over time from a simulation of the RLS-based APD of the first embodiment.
Figure 10:
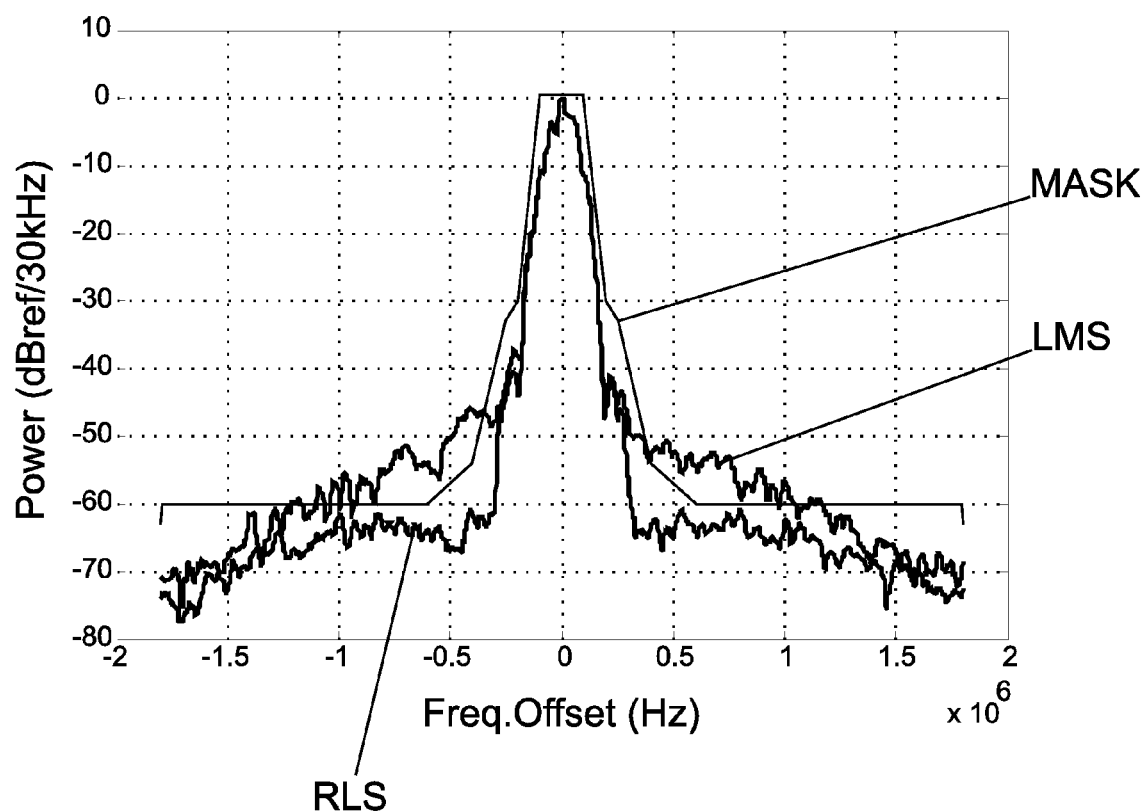
FIG. 10 is a plot of the modulation ORFS behaviour of the traditional LMS-based APD and the RLS-based APD of the first embodiment.

To demonstrate the benefits of the first embodiment over a traditional LMS-based APD, simulations were performed of both systems. In particular, the conventional LMS-based APD system was simulated with μ=0.3. Similarly, the first embodiment was simulated with an initial value for the adaptation factor $\mu_0$=0.3 and forgetting factor λ=0.01. The results of the simulations are shown in FIGS. 7 to 10. Referring to FIG. 7, it can be seen that the gain coefficients in the conventional LMS-based APD converge quite slowly to their optimum values. In contrast, referring to FIG. 8, it can be seen that the gain coefficients in the first embodiment change very quickly at the start; and rapidly converge to their optimal values. Referring to FIG. 9, it can be seen that the learning factors (for each gain coefficient) in the first embodiment all decrease over time to their optimal value. Accordingly, it is also possible to use a proportionally larger initial learning factor in the embodiment (compared with a traditional LMS APD system) to facilitate rapid initial convergence.

The extremely rapid convergence of the gain coefficients in the first embodiment (as compared with the slower convergence of the gain coefficients in the conventional LMS APD system) enables it to more rapidly learn the predistortion needed to overcome the effects of PA non-linearities. Thus, the first embodiment is capable of more rapidly providing the required predistortion, so that referring to FIG. 10, the modulation ORFS of the first embodiment falls within the mask of the required specifications, whereas the conventional LMS-based APD fails specification, because its modulation ORFS fall outside of the mask (particularly near the 400 KHz corner). In particular, a >10 dB improvement is seen between the 400 kHz modulation ORFS of the first embodiment as compared against that of the conventional LMS-based APD system.

Generalising from the present example, the embodiment removes the compromise necessary in traditional LMS-based APD systems, between convergence speed and noise rejection. In particular, both objectives can be achieved in the embodiments by suitable configuration of the RLS parameters (initial adaptation factor and forgetting factor). The combination of the RLS algorithm with the individual learning factors in the embodiment also provides superior predistortion performance in the case of PAs with memory. Under these circumstances, a conventional LMS-based algorithm would be unable to converge below a residual noise floor, caused by the time-varying PA characteristic. In contrast, as convergence occurs in the embodiment, the collapsing adaptation factors effectively smooth or filter out the 'chasing noise' (i.e. noise of the predistortion gain estimates). Accordingly, the embodiment provides greater noise immunity (thereby allowing the embodiment to work over a wider CINR) than the traditional LMS-based APD systems, without compromising performance. In particular, the embodiment is more immune to circuit noise, numerical noise, implicit noise (e.g. adjacent channel interference and PA memory effect noise).

Moreover, even where noise is not a dominating factor, the time-varying gain of the first embodiment, allows it to always out-perform the convergence time of a traditional LMS-based APD. Thus, the overall tracking or adaptation rate of the embodiment will be superior, leading to improved transient performance (particularly switching ORFS when starting from a blind start). More generally, the embodiment provides a mechanism for attaining greater margin to critical cellular 3GPP specifications such as SW-ORFS without compromising existing noise performance, thereby leading to realization of greater PA efficiencies.

Possible extensions from the above-described embodiments include resetting the adaptation gain at the start of a slot; resetting the APD system if the estimation error exceeds an upper threshold etc; and turning off the algorithm and feedback loops therein, when the adaptation gain converges below a lower threshold.

Modifications and alterations may be made to the above description, without departing from the scope of the invention.

The invention claimed is:

1. A method of adaptive predistortion of a power amplifier, characterised in that the method comprises the steps of:
    storing values of a plurality of corresponding first and second coefficients;
    selecting one of the stored first coefficients;
    processing a first signal with the first coefficient to produce an input signal for the power amplifier;
    amplifying the input signal in the power amplifier to produce an output signal;

calculating an error value from the output signal and a previously selected first coefficient;

selecting a stored second coefficient corresponding with the previously selected first coefficient;

updating the previously selected first coefficient with a value calculated from the error value and the second coefficient;

updating the second coefficient; and replacing the previously selected first coefficient and corresponding second coefficient with the updated first and second coefficients respectively.

2. The method as claimed in claim 1, wherein the step of updating the second coefficient comprises the step of progressively decreasing the value of the second coefficient.

3. The method as claimed in claim 2, wherein the step of updating the second coefficient comprises the step of updating the second coefficient with a first order exponential decay term.

4. The method as claimed in claim 2, wherein the step of updating the second coefficient comprises the step of updating the second coefficient with an expression modelled after the covariance matrix of the recursive least squares algorithm.

5. The method as claimed in claim 2, wherein the step of updating the second coefficient comprises the step of resetting the updated second coefficient to a value substantially equal to zero in the event that the updated second coefficient is negatively valued.

6. The method as claimed in claim 2, wherein the method further comprises the steps of resetting the method in the event that the error value exceeds a pre-defined threshold.

7. The method as claimed in claim 1, wherein the step of updating the second coefficient comprises the step of updating the second coefficient with a first order exponential decay term.

8. The method as claimed in claim 7, wherein the step of updating the second coefficient with a first order exponential decay term comprises the step of updating the second coefficient with a first order exponential decay term in the event that the sign of the error does not match that of the error calculated when that first coefficient was last selected.

9. The method as claimed in claim 8, wherein the step of updating the second coefficient with a first order exponential decay term comprises the step of multiplying the second coefficient with a constant term of value between 0 and 1.

10. The method as claimed in claim 7, wherein the step of updating the second coefficient with a first order exponential decay term comprises the step of multiplying the second coefficient with a constant term of value between 0 and 1.

11. The method as claimed in claim 7, wherein the step of updating the second coefficient comprises the step of resetting the updated second coefficient to a value substantially equal to zero in the event that the updated second coefficient is negatively valued.

12. The method as claimed in claim 1, wherein the step of updating the second coefficient comprises the step of updating the second coefficient with an expression modelled after the covariance matrix of the recursive least squares algorithm.

13. The method as claimed in claim 12, wherein the step of updating the second coefficient comprises the step of decreasing the second coefficient with the expression $$\frac{\mu\{|x(n-D)|\}^2 |x(n-D)|^2}{1+|x(n-D)|^2 \mu\{|x(n-D)|\}}\lambda,$$

wherein $0<=\lambda<=1$, and wherein n is a time instant, D is a delay time, $x(n-D)$ is the first signal at delayed time instant $n-D$, and $\mu\{|x(n-D)|\}$ is an adaptation factor depending on an absolute value of $x(n-D)$.

14. The method as claimed in claim 12, wherein the step of updating the second coefficient comprises the step of resetting the updated second coefficient to a value substantially equal to zero in the event that the updated second coefficient is negatively valued.

15. The method as claimed in claim 1, wherein the step of updating the second coefficient comprises the step of resetting the updated second coefficient to a value substantially equal to zero in the event that the updated second coefficient is negatively valued.

16. The method as claimed in claim 1, wherein the method further comprises the steps of resetting the method in the event that the error value exceeds a pre-defined threshold.

17. The method as claimed in claim 1, wherein the method comprises the step of terminating the method in the event that a second coefficient has a value below a pre-defined lower threshold.

18. A power amplifier apparatus comprising:
a power amplifier;
an adaptive predistorter;
at least two look-up tables comprising substantially the same number of elements;
a seeding means adapted to provide and store a plurality of first coefficients in the first look-up table and a plurality of corresponding second coefficients in the second look-up table;
a first selection means adapted to select one of the first coefficients from the first look-up table;
a processing means adapted to process a first signal with the selected first coefficient to produce an input signal for the power amplifier;
an error calculating means adapted to calculate an error value from an output signal from the power amplifier and a previously selected first coefficient;
a second selection means adapted to select a stored second coefficient corresponding with the previously selected first coefficient;
a first adaptation engine adapted to update the previously selected first coefficient with a value calculated from the error value and the second coefficient;
a second adaptation engine adapted to update the second coefficient; and
a data writing means adapted to replace the previously selected first coefficient in the first look-up table with the updated first coefficient; and to replace the corresponding second coefficient in the second look-up table with the updated second coefficient.

19. A wireless transmitter comprising the apparatus as claimed in claim 18.

20. A wireless handset comprising the apparatus as claimed in claim 18.

* * * * *